United States Patent [19]

Lauffer et al.

[11] Patent Number: 4,734,820

[45] Date of Patent: Mar. 29, 1988

[54] CRYOGENIC PACKAGING SCHEME

[75] Inventors: Donald K. Lauffer, Poway; Ikuo J. Sanwo, San Marcos; Donald G. Tipon, San Diego, all of Calif.

[73] Assignee: NCR Corporation, Dayton, Ohio

[21] Appl. No.: 39,056

[22] Filed: Apr. 16, 1987

[51] Int. Cl.$^4$ .............................................. H05K 7/20
[52] U.S. Cl. ..................................... 361/385; 29/879;
165/80.4; 174/15 CA; 357/83; 361/413;
439/179
[58] Field of Search ............................ 165/80.4, 104.33;
174/15 R, 15 CA, 16 R; 357/82, 83;
361/382–383, 385, 396, 410, 413; 439/176, 196,
485; 29/877–879

[56] References Cited

U.S. PATENT DOCUMENTS

| | | | |
|---|---|---|---|
| 411,370 | 9/1889 | Barrett | 439/179 |
| 1,621,381 | 3/1927 | Sinclaire | 439/179 |
| 4,302,793 | 11/1981 | Rohner | 174/15 R |
| 4,528,530 | 7/1985 | Ketcher | 361/413 |

FOREIGN PATENT DOCUMENTS 0003022  4/1904  United Kingdom .................. 29/879

OTHER PUBLICATIONS

Stackhouse, "Module Package with Heat Sink Between Substrate and Circuit Board", IBM Technical Disclosure Bulletin, vol. 22, No. 4, 9/79, pp. 1428–1429.

Rideout, "Close-Cycle Nitrogen Refrigeration System for Low-Temperature Computer Operation", IBM Technical Disclosure Bulletin, vol. 18, No. 4, 9/75, pp. 1226–1229.

Seely, "Cooling System", IBM Technical Disclosure Bulletin, vol. 11, No. 7, 12/68, p. 833.

Chu et al, "Thermal Card and Deflector System for Augmenting Emersion Cooling", IBM Technical Disclosure Bulletin, vol. 10, No. 10, 3/68, pp. 1559–1560.

Primary Examiner—A. D. Pellinen
Assistant Examiner—Gregory P. Thompson
Attorney, Agent, or Firm—Wilbert Hawk, Jr.; Edward Dugas

[57] ABSTRACT

Apparatus and method for removably mounting an integrated circuit package having a plurality of electrical pins wherein a plurality of mating pins each having a receptacle filled with liquid mercury are connected to the electrical pins of the integrated circuit package and the temperature reduced such that the liquid mercury solidifies thereby firmly bonding the electrical pins together. The assembly may be inserted into a Dewar type vessel and covered with a low temperature liquified gas for the dual purpose of solidfying the liquid mercury and cooling the integrated circuit package.

3 Claims, 2 Drawing Figures

CRYOGENIC PACKAGING SCHEME

BACKGROUND OF THE INVENTION

This invention relates generally to zero force connectors for removably mounting large integrated circuits such as Pin Grid Arrays (PGA) which may have upwards of 200 pins and which are immersed in liquid gases such as Nitrogen or Helium for cooling and/or performance enhancement.

More specifically, this invention provides a means and a method of packaging an electrical network within a cryogenic vessel filled with a liquified gas for cooling purposes. It also provides a means and a method for plugging and unplugging the electrical device with ease at room temperatures, yet provides for a sound, reliable electrical and mechanical connection at cryogenic temperatures. A means is provided to thermally isolate the immersed circuit from the outside temperature by using a vacuum insulation vessel with carbon leads that thermally isolate the interconnections.

A number of prior art patents deal with the problem of cooling semiconductors and with the problem of making electrical connections to integrated circuit packages which packages are cooled either by immersion into the cooling liquid by heat sinks which are in contact with the cooling fluid. The following is a representative listing of such prior art patents:

U.S. Pat. No. 3,356,864, entitled "ELECTRON TUNNEL EMISSION DEVICES SYSTEMS" by I. Giaever;

U.S. Pat. No. 3,365,620, entitled "CIRCUIT PACKAGE WITH IMPROVED MODULAR ASSEMBLY AND COOLING APPARATUS" by J. H. Butler et al.;

U.S. Pat. No. 3,417,575, entitled "METHOD OF AND MEANS FOR COOLING SEMICONDUCTOR DEVICES" by E. H. Stark;

U.S. Pat. No. 4,166,665, entitled "LIQUID COOLED CONNECTOR FOR LARGE SCALE INTEGRATED CIRCUIT PACKAGES" by J. M. Cutchaw; and U.S. Pat. No. 4,341,432, entitled "LIQUID COOLED CONNECTION FOR INTEGRATED CIRCUIT PACKAGES" by J. M Cutchaw.

SUMMARY OF THE INVENTION

The unique features of the present invention are that it (1) provides for a method of interconnecting an electrical network, or integrated circuit which is immersed in a liquid, to a printed circuit board assembly that is not immersed, (2) provides for a means of plugging-in and unplugging a many pin, "Pin Grid Array (PGA) Package" into a novel socket with zero force (at room temperature) that will provide solid reliable electrical and mechanical interconnection at cryogenic temperatures below minus 38.8° C. using Mercury (Hg) as a solder material, (3) provides for a means of interconnection from a network located in a cold cryogenic temperature to a room temperature printed circuit board assembly using a high electrical conductivity yet low thermal conductivity media (such as carbon) as a buffer media to minimize thermal conduction out of the cryogenic chamber through the electrical interconnection, and (4) provides for a protective enclosure for the cryogenic package to meet safety requirements.

In one preferred embodiment of the invention, there is provided an integrated circuit package having a plurality of electrical connecting pins and a vessel for holding a low temperature liquified gas. The vessel is provided with a plurality of openings therethrough corresponding to the plurality of electrical pins of the integrated circuit package. A plurality of pins having a cup end containing mercury are mounted, one each, in the plurality of electrical pins of the integrated circuit package prior to the addition of the low temperature liquified gas. The plurality of electrical pins are securely connected to the plurality of pins having a cup end by adding a low temperature liquified gas to the vessel to solidify the mercury in each of the cup ends of the plurality of pins. An electrically conductive and thermally insulating material is used to connect the plurality of cup end pins to circuitry external of the vessel.

Accordingly, it is a primary object of the present invention to provide an improved cryogenic packaging assembly.

It is another object of the present invention to provide an integrated circuit package mounting which permits easy insertion and removal to and from a circuit board.

Still another object of the present invention is to provide interconnections between an electrical circuit located in a low temperature environment and electrical circuits located in a higher temperature emvironment.

These and other objects of the present invention will become more apparent when taken in conjunction with the following description and drawings wherein like characters indicate like parts and which drawings from a part of the present disclosure.

DETAILED DESCRIPTION OF THE PREFERRED EMBODIMENT OF THE INVENTION

Figure 1:
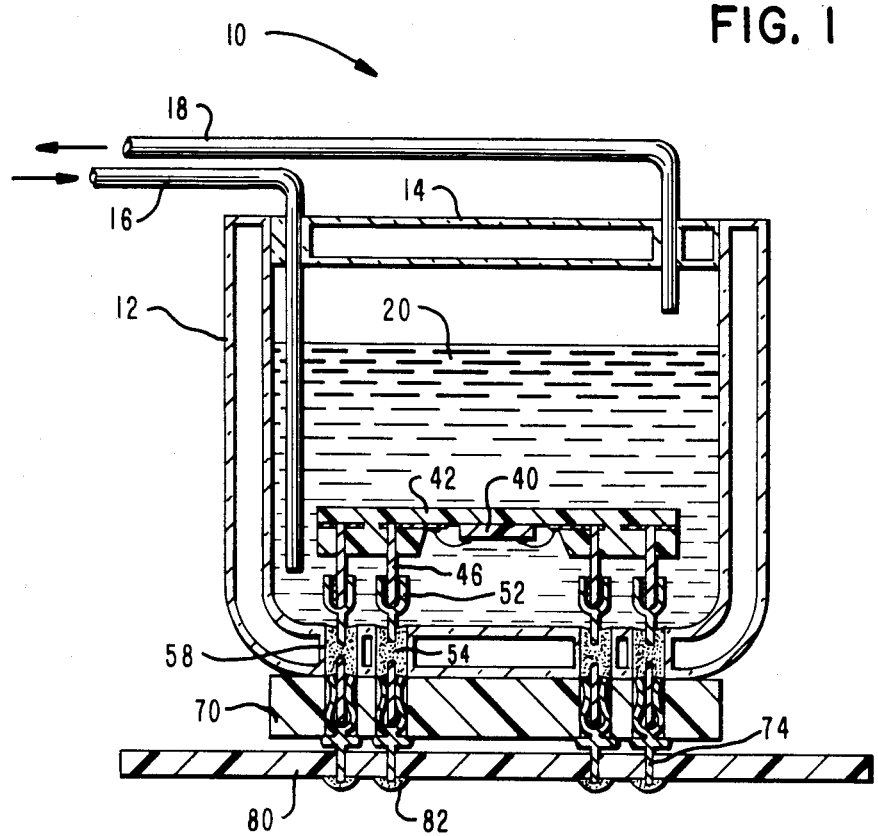
FIG. 1 is a full sectioned view of the preferred embodiment of the invention.
Figure 2:
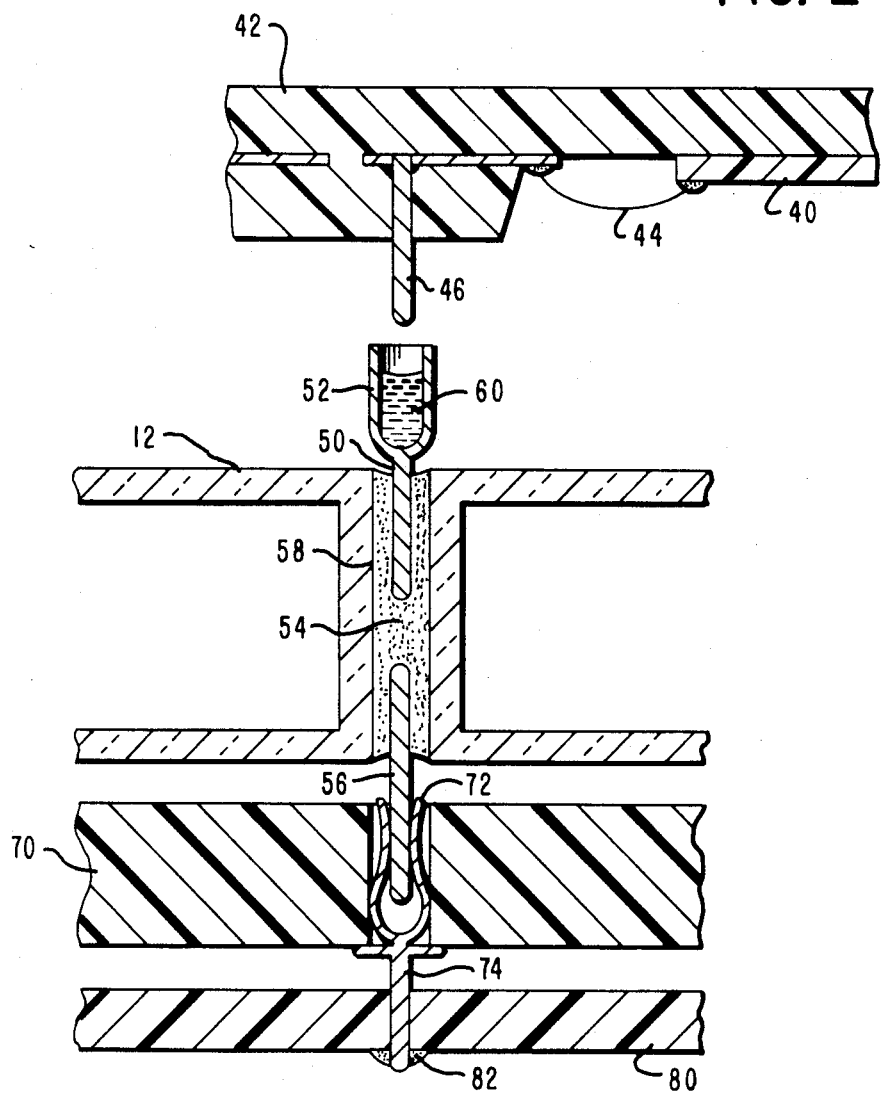
FIG. 2 is a enlarged view of a portion of the preferred embodiment of FIG. 1.

Referring to FIGS. 1 and 2, the cryogenic packaging for an IC chip is shown generally as item 10. The cryogenic packaging 10 is comprised of a vessel 12 which may be a Dewar vessel having a closed but removable top 14 into which vessel is placed a low temperature liquified gas 20 such as Nitrogen, Freon, Argon and Helium. Within the vessel 12 is positioned an IC chip 40 mounted in a pin grid array package 42 having electrical conductors 44 and which package has a plurality of electrical connecting pins 46 extending therefrom. A corresponding plurality of openings 58 are formed through the wall of the vessel 12. A corresponding number of pins 50 having an open receiver portion 52 shaped as a cup are embedded in an electrically conductive and thermally insulated material 54 which fills the openings 58. The open receiver portion 52 is partially filled with Mercury 60. The material 54 may be carbon which functions as a buffer media to minimize thermal conduction out of the cryogenic chamber through the electrical interconnections. A corresponding plurality of electrical pins 56 are inserted into the carbon material and extend outwards from the vessel 12. These electrical pins are configured and positioned so as to mate with connector pins 72 mounted in a receiving pin grid array 70. Each of the pines 72 has a projecting segment 74 designed to mate with conductors (circuitry) on a PC board 80 and to be soldered to a conductor at 82.

To insert the connecting pins 46 of package 42 into the open receiver portion 52 with a zero force, the temperature of the Mercury 60 is raised so that it is more positive than minus 38.8° C. since the Mercury in the connector pins is in a liquid state at these temperatures. The IC chip 40 can then either be inserted and/or removed and a new IC chip inserted without the necessity of unsoldering all of the connectors. Once the IC chip is in place, the temperature is lowered causing the mercury to solidify, thus forming an electrical and mechanical connection similar to that of tin/lead eutectic solder. The tube 18 extending through the top 14 of the vessel 12 is used to take of the liquified gas commonly called the boil-off so that the gas can be reprocessed to form it back into a liquid and to reinject it, via the tube 16, back into the vessel 12.

While there has been shown what is considered to be the preferred embodiment of the invention, it will be manifest that many changes and modifications may be made therein without departing from the essential spirit of the invention. It is intended, therefore, in the annexed claims, to cover all such changes and modifications that may fall within the true scope of the invention.

We claim:

1. An integrated circuit package comprising:
   a Dewar vessel;
   an integrated circuit chip having a plurality of electrical conductors;
   a pin grid array package mounting said integrated circuit chip, said pin grid array package having a plurality of pin conductors projecting from a surface of the pin grid array package which pin conductors are in electrical contact with the electrical conductors of said integrated circuit chip;
   a plurality of openings through said Dewar vessel, corresponding in location to the plurality of pin conductors projecting from the surface of the pin grid array package;
   a low thermal, electrically conductive, material filling each of said plurality of openings;
   a plurality of electrically conductive pins each embedded at one end in said low thermal, electrically conductive, material and having at the opposite end an open receiver holding an amount of mercury, said plurality of electrically conductive pins extending toward the inner part of the Dewar vessel so as to engage corresponding ones of said plurality of pin conductors projecting from said pin grid array package;
   a plurality of electrical conductive connector pins each embedded at one end in said low thermal electrically conductive material and projecting outward from said Dewar vessel; and
   a receiving pin grid array receiving the plurality of electrically conductive connector pins projecting outward from said Dewar vessel to facilitate the electrical connection of said integrated circuit chip to a printed circuit board.

2. The integrated circuit package according to claim 1 wherein said Dewar vessel contains a low temperature liquified gas covering said integrated circuit chip and the mercury in the open receivers for solidifying said mercury thus forming an improved electrical and mechanical connection.

3. A connector assembly for removably mounting and electrically connecting a cryogenically cooled integrated circuit package comprising:
   an integrated circuit package having a plurality of electrical pins;
   a vessel holding a low temperature liquified gas having a plurality of openings therethrough corresponding to the plurality of pins of said integrated circuit package;
   a plurality of pins each having a cup end containing mercury mounted, one each, in said plurality of openings receiving the plurality of electrical pins of said integrated circuit package prior to the addition of a low temperature liquified gas to said vessel and securely connecting said plurality of electrical pins to the corresponding plurality of pins having a cup end by adding a low temperature liquified gas to said vessel to solidify the mercury in each of the cup ends of said plurality of pins; and
   means electrically coupling and thermally insulating each of said plurality of pins to circuitry external of said vessel.

* * * * *